(12) United States Patent
Li et al.

(10) Patent No.: US 9,099,356 B2
(45) Date of Patent: Aug. 4, 2015

(54) ARRAY SUBSTRATE WITH HOLLOWED COMMON ELECTRODE ABOVE DATA LINE AND MANUFACTURING METHOD THEREOF AND DISPLAY DEVICE

(71) Applicant: BEIJING BOE OPTOELECTRONICS TECHNOLOGY CO., LTD., Beijing (CN)

(72) Inventors: Cheng Li, Beijing (CN); Xue Dong, Beijing (CN); Dong Chen, Beijing (CN); Suzhen Mu, Beijing (CN)

(73) Assignee: BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 68 days.

(21) Appl. No.: 13/704,764

(22) PCT Filed: Sep. 25, 2012

(86) PCT No.: PCT/CN2012/081899
§ 371 (c)(1),
(2) Date: Dec. 17, 2012

(87) PCT Pub. No.: WO2013/044783
PCT Pub. Date: Apr. 4, 2013

(65) Prior Publication Data
US 2014/0054617 A1    Feb. 27, 2014

(30) Foreign Application Priority Data
Sep. 26, 2011    (CN) .......................... 2011 1 0288421

(51) Int. Cl.
*H01L 29/18* (2006.01)
*H01L 27/12* (2006.01)

(52) U.S. Cl.
CPC .......... *H01L 27/124* (2013.01); *H01L 27/1259* (2013.01)

(58) Field of Classification Search
USPC .................................................. 257/59, 72, 88
See application file for complete search history.

(56) References Cited

U.S. PATENT DOCUMENTS

2006/0250535 A1 * 11/2006 Chae .............................. 349/43
2007/0296901 A1    12/2007 Seo et al.
(Continued)

FOREIGN PATENT DOCUMENTS

| CN | 101093329 A | 12/2007 |
| CN | 101995709 A | 3/2011 |
| CN | 102629606 A | 8/2012 |

OTHER PUBLICATIONS

International Preliminary Report on Patentability dated Apr. 1, 2014; PCT/CN2012/081899.
First Chinese Office Action dated Mar. 5, 2014; Appln. No. 201110288421.5.
(Continued)

*Primary Examiner* — Bilkis Jahan
(74) *Attorney, Agent, or Firm* — Ladas & Parry LLP

(57) ABSTRACT

Embodiments of the present invention provide an array substrate, comprising: a base substrate; a gate line and a data line formed on the base substrate, the gate line and the data line crossing with each other to define a pixel region; a thin film transistor and a pixel electrode, disposed in the pixel region; a strip-like common electrode, disposed above the pixel electrode and the data line, the common electrode comprising a first common electrode which covers above the data line and has a width greater than that of the data line; and a second common electrode, disposed above the pixel electrode; an insulating layer, disposed between the common electrode and the pixel electrode as well as between the common electrode and the data line, wherein a region of the first common electrode corresponding to the data line is hollowed out.

7 Claims, 2 Drawing Sheets

(56) References Cited

U.S. PATENT DOCUMENTS

2009/0191656 A1* 7/2009 Inoue et al. ............... 438/30
2011/0050672 A1* 3/2011 Choi ....................... 345/211
2011/0156165 A1 6/2011 Jang et al.
2012/0176561 A1* 7/2012 Kim et al. ................. 349/46
2013/0114017 A1* 5/2013 Qin et al. .................. 349/43

OTHER PUBLICATIONS

International Search Report mailed Jan. 10, 2013; PCT/CN2012/081899.

Second Chinese Office Action dated Aug. 7, 2014; Appln. No. 201110288421.5.

* cited by examiner

ARRAY SUBSTRATE WITH HOLLOWED COMMON ELECTRODE ABOVE DATA LINE AND MANUFACTURING METHOD THEREOF AND DISPLAY DEVICE

FIELD OF THE INVENTION

Embodiments of the present invention relate to an array substrate, a manufacturing method thereof and a display device.

BACKGROUND OF THE INVENTION

An Advanced Super Dimension Switch (simply referred to as ADS) technology, by forming a multi-dimensional electric field with an electric field generated from edges of slit-electrodes in the same plane and an electric field generated between a slit-electrode layer and a plate-electrode layer, enables liquid crystal molecules in all orientations between the slit-electrodes and directly above the electrodes within a liquid crystal cell to rotate, thereby improving work efficiency of the liquid crystal and increasing light transmission efficiency. The image quality of a Thin Film Transistor Liquid Crystal Display (TFT-LCD) product can be improved by the ADS technology, so as to have advantages such as high resolution, high transmittance, low power consumption, wide viewing angle, high aperture ratio, low chromatic aberration, and being free of push mura, etc. In an existing ADS mode liquid crystal display, a common electrode and a pixel electrode are made from a transparent conductor, thereby increasing the aperture ratio and the light transmittance; moreover, a space formed between the common electrode and the pixel electrode is narrower than a space between the upper and the lower substrates, thus a fringing electric field is formed between the common electrode and the pixel electrode, so that the rotation switching of the liquid crystal molecules occurs in a planar direction parallel to the substrates, thereby improving the light transmission efficiency of the liquid crystal layer.

In order to avoid the influence of a light-shielding region above a data line on the aperture ratio, and to improve the transmittance of a pixel, the prior art provides a pixel structure, as shown in FIG. 1, which removes the light-shielding region above the data line 1, and disposes a strip-like common electrode 2 parallel to the data line 1. One part of the strip-like common electrode 2 is disposed above a pixel electrode 3, while the other part of the strip-like common electrode 2 covers above the data line 1, with a width greater than that of the data line 1. Through covering the data line 1 by the common electrode 2 to suppress the interference of the data line 1 on the electric field for liquid crystal, the adverse influence such as light leakage, etc. can be avoided, thereby improving the transmittance of pixels.

However, the inventors found that, the load on a data line in the pixel structure of the prior art is too much, and the capacitance between the data line and the common electrode covering thereon occupies the largest proportion with respect to the power consumption, causing a significant increase in the overall power consumption of the liquid crystal panel.

SUMMARY OF THE INVENTION

An embodiment of the present invention provides an array substrate, comprising: a base substrate, a gate line and a data line formed on the base substrate, the gate line and the data line crossing with each other to define a pixel region; a thin film transistor and a pixel electrode, disposed in the pixel region; a strip-like common electrode, disposed above the pixel electrode and the data line, the common electrode comprising a first common electrode which covers above the data line and has a width greater than that of the data line, and a second common electrode which is disposed above the pixel electrode; an insulating layer, disposed between the common electrode and the pixel electrode as well as between the common electrode and the data line, wherein a region of the first common electrode corresponding to the data line is hollowed out.

Another embodiment of the present invention provides a method for manufacturing an array substrate, comprising: forming a gate line, a data line, a thin film transistor and a pixel electrode on a base substrate, a gate electrode of the thin film transistor being connected with the gate line, a source electrode of the thin film transistor being connected with the data line, and a drain electrode of the thin film transistor being connected with the pixel electrode; and on the base substrate formed with the gate line, the data line, the thin film transistor and the pixel electrode, forming an insulating layer, and forming a strip-like common electrode on the insulating layer, the common electrode comprising a first common electrode which covers above the data line and has a width greater than that of the data line, and a second common electrode which is disposed above the pixel electrode, wherein a region of the first common electrode corresponding to the data line is hollowed out.

A further embodiment of the present invention provides a display device, the display device comprising an array substrate in accordance with any embodiment of the present invention.

BRIEF DESCRIPTION OF THE DRAWINGS

In order to clearly illustrate the technical solutions of the embodiments of the invention, the drawings of the embodiments will be briefly described in the following; it is obvious that the described drawings are only related to some embodiments of the invention and thus are not limitative of the invention.

DETAILED DESCRIPTION OF THE PREFERRED EMBODIMENTS

In order to make objects, technical details and advantages of the embodiments of the invention apparent, the technical solutions of the embodiments will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Embodiments of the present invention provide an array substrate, a manufacturing method thereof and a display device, which can greatly reduce the load on the data line without affecting the transmittance of pixels, thereby reducing the power consumption of the liquid crystal panel.

First Embodiment

Figure 1:
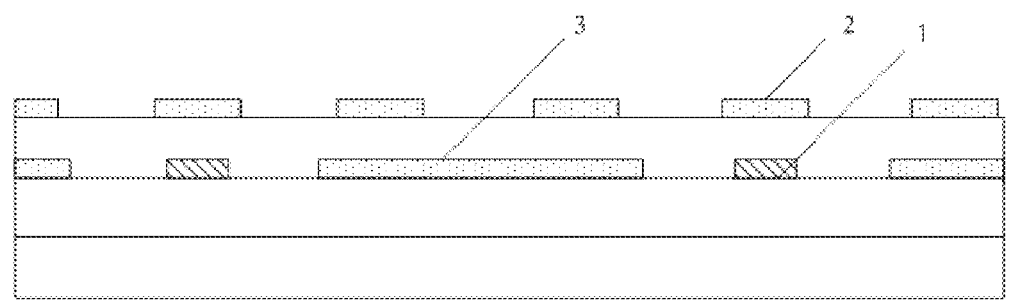
FIG. 1 is a schematic view of a sectional structure of an array substrate in the prior art.
Figure 2:
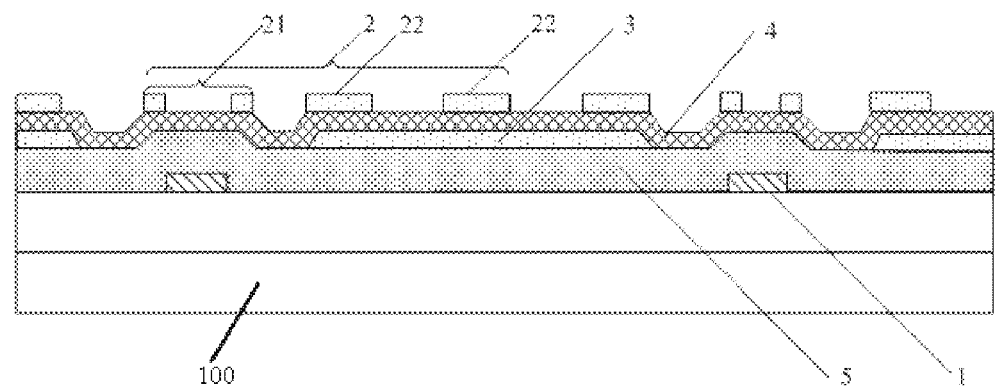
FIG. 2 is a first schematic view of a sectional structure of an array substrate in an embodiment of the present invention.

An embodiment of the present invention provides an array substrate, as shown in FIG. 2, the array substrate comprising:

a pixel region on a base substrate 100 defined by a gate line (not shown in the figure) and a data line 1 which cross with each other, the pixel region being provided therein with a thin film transistor (not shown in the figure) and a pixel electrode 3; a striplike common electrode 2 which cooperates with the pixel electrode 3 to produce an electric field, the common electrode 2 being disposed above the pixel electrode 3 and the data line 1, and an insulating layer 4 being disposed between the common electrode 2 and the pixel electrode 3 as well as between the common electrode 2 and the data line 1. The common electrode 2 comprises: a first common electrode 21 covering above the data line 1 and having a width greater than that of the data line 1, and a second common electrode 22 disposed above the pixel electrode 3, a region of the first common electrode 21 corresponding to the data line 1 being hollowed out. That is, a part of the first common electrode 21 directly above the data line 1 is removed. The skilled in the art will understand that, the strip-like common electrode 2 is conductively communicated in the whole, i.e., the first common electrode 21 and the second common electrode 22 are conductively communicated (not shown in the sectional view). For example, the first common electrode 21 and the second common electrode 22 may be connected to each other at a portion outside of the portion shown in the sectional view.

Further, the pixel electrode, the thin film transistor, the data line, the gate line and etc. as mentioned above each may adopt any suitable structure in the prior art. For example, the thin-film transistor may comprise a gate electrode, a source electrode and a drain electrode. The gate electrode of the thin film transistor is connected with the gate line, the source electrode of the thin film transistor is connected with the data line 1, and the drain electrode of the thin film transistor is connected with the pixel electrode 3.

In the scheme provided by the prior art, a common electrode completely covers over a data line, causing the load on the data line is too much, and the capacitance between the data line and the common electrode covering over the data line occupies the largest proportion with respect to the power consumption, resulting in a significant increase in the overall power consumption of the liquid crystal panel. In the array substrate provided by this embodiment, the first common electrode covering above the date line adopts a structure that a region thereof corresponding to the data line is hollowed out, and this can greatly reduce the parasitic capacitance on the data line, thereby reducing the power consumption.

Preferably, the arrangement direction of the strip-like common electrode is parallel to the arrangement direction of the data line, i.e., the arrangement direction of the first common electrode 21 and the second common electrode 22 are parallel to the arrangement direction of the data line.

Figure 3:
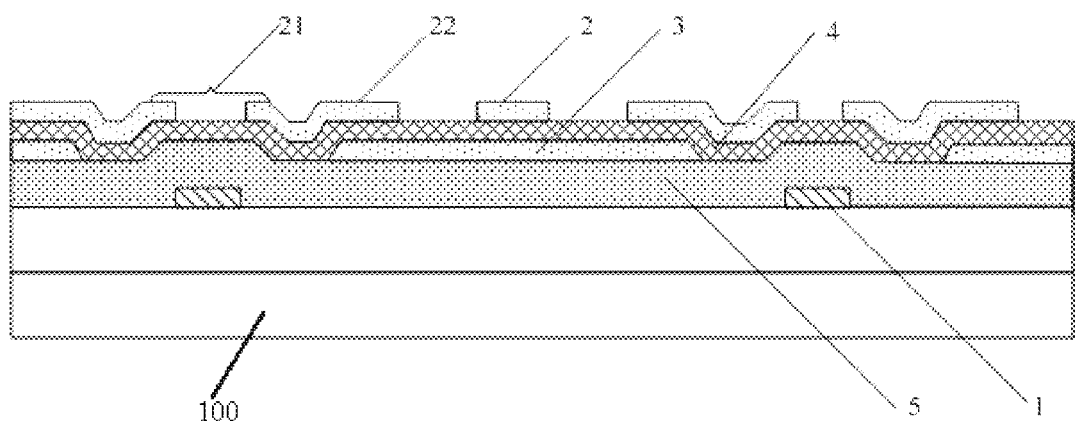
FIG. 3 is a second schematic view of a sectional structure of an array substrate in an embodiment of the present invention.

Further, within each pixel region (or above each pixel electrode 3), there may be a plurality of second common electrodes 22, as shown in FIG. 2 and FIG. 3. Within each pixel region, the plurality of second common electrodes 22 are arranged equidistantly. Within the pixel region, the strip-like common electrodes are formed to be arranged equidistantly, therefore it is capable of forming a relatively uniform electric field, and has better optical characteristics.

Still further, as shown in FIG. 3, in order to suppress the interference caused by the data line 1 on the electric field for liquid crystal, an edge of the first common electrode 21 needs to be made wide enough, so that the edge of the first common electrode 21 may be connected with an edge of a second common electrode 22 which is adjacent thereto.

Further, as shown in FIG. 2 and FIG. 3, in order to prevent the interference caused by the data line 1 on the electric field for liquid crystal after the first common electrode 21 is hollowed out, a resin layer 5 is disposed between the layer where the data line 1 is located and the layer where the common electrode 2 is located, and the resin layer 5 adopts a resin material. The resin layer has a relatively low dielectric constant and a relatively large thickness, which makes a great improvement in reducing the adverse influence of the data lines on the electric field for liquid crystal. Those skilled in the art will understand that, the resin material should be a transparent material; besides, the insulating layer 4 described above should also be a transparent material.

It should be noted that, the resin layer 5 may be disposed at any layer between the layer where the data line 1 is located and the layer where the common electrode 2 is located; for example, the resin layer 5 is disposed between the layer where the data line 1 is located and the layer where the pixel electrode 3 is located, this can effectively reduce the interference caused by the data line on the electric field for liquid crystal, and will not affect the storage capacitance between the common electrode 2 and the pixel electrode 3. Those skilled in the art will understand that, in various embodiments of the present invention, except that the common electrode and its associated design are different from the prior art, the other parts all can use an appropriate prior art. For example, when the resin layer 5 is disposed between the data line 1 and the pixel electrode 3, it is required to open a via hole in the resin layer in the pixel design for connecting between the drain electrode of a TFT and the pixel electrode 3; when the resin layer 5 is disposed between the pixel electrode 3 and the common electrode 2, the drain electrode of a TFT drain may be directly connected to the pixel electrode 3 in designing the pixel, and therefore the design of a via hole may not be needed. Further, when the resin layer 5 is disposed between the pixel electrode 3 and the common electrode 2, the insulating layer 4 may also be omitted.

In the technical solution of this embodiment, an electric field is formed by a planar pixel electrode at the bottom portion and a strip-like common electrode at the upper portion, the common electrode at the upper portion being spaced from the pixel electrode at the bottom portion by an insulating layer. The strip-like common electrode at the upper portion comprises: a hollowed out first common electrode locating above a data line and covering the edges of the data line, and a second common electrode above a pixel electrode. With such a design scheme, not only the transmittance of pixels will not be affected, but also the load on the data line can be greatly reduced, thereby reducing the power consumption of the liquid crystal panel.

Second Embodiment

This embodiment of the invention provides a method for manufacturing an array substrate as described in the above embodiment, the method comprising:

Step 101: forming a gate line, a data line, a thin film transistor and a pixel electrode on a base substrate, a gate electrode of the thin film transistor being connected with the gate line, a source electrode of the thin film transistor being connected with the data line, and a drain electrode of the thin film transistor being connected with the pixel electrode;

Step 102: on the base substrate formed with the gate line, the data line, the thin film transistor and the pixel electrode, forming a strip-like common electrode which cooperates with the pixel electrode to produce an electric field, with an insulating layer disposed between the common electrode and the pixel electrode. That is, firstly forming an insulating layer on the base substrate, and then forming a strip-like common electrode on the insulating layer. The common electrode comprises: a first common electrode covering above the data line and having a width greater than that of the data line, and a second common electrode disposed above the pixel electrode, a region of the first common electrode corresponding to the data line being hollowed out.

Further, the arrangement direction of the strip-like common electrode is parallel to the arrangement direction of the data line. That is, the arrangement direction of the first common electrode and the second common electrode are parallel to the arrangement direction of the data line.

Further, the second common electrode within each pixel region is arranged equidistantly. That is, there are a plurality of second common electrodes arranged equidistantly directly above each pixel electrode. Within the pixel region, the strip-like common electrodes are formed to be arranged equidistantly, therefore it is capable of forming a relatively uniform electric field, and has better optical characteristics.

Further, in order to suppress the interference caused by the data line on the electric field for liquid crystal, an edge of the first common electrode needs to be made wide enough, so that the edge of the first common electrode may be connected with an edge of a second common electrode which is adjacent thereto.

Further, in order to prevent the interference caused by the data line on the electric field for liquid crystal ater the first common electrode is hollowed out, the method further comprises: Disposing a resin layer between the layer where the data line is located and the layer where the common electrode is located. This step needs to be implemented in a certain relevant step in step 101, for instance, after the formation of the data line and before the formation of the pixel electrode.

The resin layer adopts a resin material. The resin layer has a relatively low dielectric constant and a relatively large thickness, which makes a great improvement in reducing the adverse influence of the data lines on the electric field of liquid crystal. Those skilled in the art will understand that, the resin material should be a transparent material; besides, the insulating layer described above should also be a transparent material.

Disposing a resin layer between the layer where the data line is located and the layer where the common electrode is located is specifically as follows: Disposing the resin layer between the layer where the data line is located and the layer where the pixel electrode is located. Thus, it can effectively reduce the interference caused by the data lines on the electric field for liquid crystal, and will not affect the storage capacitance between the common electrode and the pixel electrode.

In the technical solution of this embodiment, an electric field is formed by a planar pixel electrode at the bottom portion and a strip-like common electrode at the upper portion, the common electrode at the upper portion being spaced from the pixel electrode at the bottom portion by an insulating layer. The strip-like common electrode at the upper portion comprises: a hollowed out first common electrode locating above a data line and covering the edges of the data line, and a second common electrode above the pixel electrode.

With such a design scheme, not only the transmittance of pixel will not be affected, but also the load on the data line can be greatly reduced, thereby reducing the power consumption of the liquid crystal panel.

Third Embodiment

This embodiment of the invention provides a display device which uses the array substrate as described in the first embodiment. The display device may be a liquid crystal panel, a mobile phone, a notebook computer, a liquid crystal display, a navigator, etc. As a result of using the array substrate in accordance with the first embodiment, the display device can greatly reduces the load on the data line without affecting the transmittance of pixel, thereby reducing the power consumption.

While the above description is just the specific implementation of the present invention, the protection scope of the present invention is not limited thereto. Within the technical scope disclosed by the present invention, modifications or alterations that are easily devised by those skilled in the art should be encompassed by the protection scope of the present invention. Therefore, the protection scope of the present invention should be defined by the protection scope of the claims.

What is claimed is:

1. An array substrate, comprising:
a base substrate;
a gate line and a data line formed on the base substrate, the gate line and the data line crossing with each other to define a pixel region;
a thin film transistor and a pixel electrode, disposed in the pixel region;
a strip-like common electrode, disposed above the pixel electrode and the data line, the common electrode comprising a first common electrode which covers above the data line and has a width greater than that of the data line, and a second common electrode which is disposed above the pixel electrode;
an insulating layer, disposed between the common electrode and the pixel electrode as well as between the common electrode and the data line,
wherein a region of the first common electrode corresponding to the data line is hollowed out,
wherein a resin layer is disposed between the layer where the data line is located and the layer where the pixel electrode is located,
wherein, within each pixel region, there are a plurality of second common electrodes, and an edge of the first common electrode is connected with an edge of the second common electrode which is adjacent thereto.

2. The array substrate according to claim 1, wherein, an arrangement direction of the strip-like common electrode is parallel to an arrangement direction of the data line.

3. The array substrate according to claim 2, wherein, the plurality of second common electrodes are arranged equidistantly within each pixel region.

4. A method for manufacturing an array substrate, comprising:
forming a gate line, a data line, a thin film transistor and a pixel electrode on a base substrate, a gate electrode of the thin film transistor being connected with the gate line, a source electrode of the thin film transistor being connected with the data line, and a drain electrode of the thin film transistor being connected with the pixel electrode; and
on the base substrate formed with the gate line, the data line, the thin film transistor and the pixel electrode, forming an insulating layer, and forming a strip-like common electrode on the insulating layer, the common electrode comprising a first common electrode which covers above the data line and has a width greater than that of the data line, and a second common electrode which is disposed above the pixel electrode, wherein a region of the first common electrode corresponding to the data line is hollowed out, wherein the method further comprises disposing a resin layer between the layer where the data line is located and the layer where the common electrode is located, wherein, the step of disposing the resin layer between the layer where the data line is located and the layer where the common electrode is located comprises:

forming the resin layer on the base substrate after the formation of the data line and before the formation of the pixel electrode, so that the resin layer is disposed between the layer where the data line is located and the layer where the pixel electrode is located, wherein there are a plurality of second common electrodes directly above the pixel electrode, and an edge of the first common electrode is connected with an edge of a second common electrode which is adjacent thereto.

5. The method according to claim 4, wherein, an arrangement direction of the strip-like common electrode is parallel to an arrangement direction of the data line.

6. The method according to claim 5, wherein, the plurality of second common electrodes are arranged equidistantly.

7. A display device comprising an array substrate, the array substrate comprising:

a base substrate;

a gate line and a data line formed on the base substrate, the gate line and the data line crossing with each other to define a pixel region;

a thin film transistor and a pixel electrode, disposed in the pixel region;

a strip-like common electrode, disposed above the pixel electrode and the data line, the common electrode comprising: a first common electrode which covers above the data line and has a width greater than that of the data line, and a second common electrode which is disposed above the pixel electrode;

an insulating layer, disposed between the common electrode and the pixel electrode as well as between the common electrode and the data line, wherein a region of the first common electrode corresponding to the data line is hollowed out, wherein a resin layer is disposed between the layer where the data line is located and the layer where the pixel electrode is located, wherein, within each pixel region, there are a plurality of second common electrodes, and an edge of the first common electrode is connected with an edge of the second common electrode which is adjacent thereto.

* * * * *